United States Patent [19]

Seidel et al.

[11] Patent Number: 5,737,234

[45] Date of Patent: Apr. 7, 1998

[54] METHOD OF OPTIMIZING RESOURCE ALLOCATION STARTING FROM A HIGH LEVEL BLOCK DIAGRAM

[76] Inventors: Jorge P. Seidel, 4976 Adair Way, San Jose, Calif. 95124; Steven K. Knapp, 3266 St. Ignatius Pl., Santa Clara, Calif. 95051

[21] Appl. No.: 672,182

[22] Filed: Jun. 27, 1996

Related U.S. Application Data

[62] Division of Ser. No. 303,295, Sep. 8, 1994, Pat. No. 5,553,001, which is a continuation of Ser. No. 784,842, Oct. 30, 1991.

[51] Int. Cl.$^6$ .................................................. G06F 17/50
[52] U.S. Cl. ............................................................ 364/488
[58] Field of Search ................................ 364/488, 489, 364/490, 491, 578

[56] References Cited

U.S. PATENT DOCUMENTS

| | | | |
|---|---|---|---|
| 4,300,196 | 11/1981 | Lopresti | 364/489 |
| 4,612,618 | 9/1986 | Pryor et al. | 364/490 |
| 4,703,435 | 10/1987 | Darringer et al. | 364/489 |
| 4,803,636 | 2/1989 | Nishiyama et al. | 364/491 |
| 4,918,614 | 4/1990 | Modarres et al. | 364/490 |
| 4,922,432 | 5/1990 | Kobayashi et al. | 364/490 |
| 4,954,953 | 9/1990 | Bush | 364/578 |
| 5,067,091 | 11/1991 | Nakazawa | 364/490 |
| 5,128,871 | 7/1992 | Schmitz | 364/490 |
| 5,260,881 | 11/1993 | Agrawal et al. | 364/489 |
| 5,333,032 | 7/1994 | Matsumoto et al. | 364/489 |
| 5,345,393 | 9/1994 | Ueda | 364/489 |
| 5,574,655 | 11/1996 | Knapp et al. | 364/489 |
| 5,610,828 | 3/1997 | Kodosky et al. | 364/489 |
| 5,623,418 | 4/1997 | Rostoker et al. | 364/489 |
| 5,661,661 | 8/1997 | Gregory et al. | 364/489 |

Primary Examiner—Kevin J. Teska
Assistant Examiner—Leigh Marie Garbowski
Attorney, Agent, or Firm—Edel M. Young; Jeanette S. Harms

[57] ABSTRACT

The more highly integrated programmable circuits include several kinds of resources for implementing the user's logic diagram. The resources provided in the chip hardware are intended to implement functions commonly specified by a user, in order for a complex chip to efficiently implement a complex design, the features called for in the design must be matched with the resources offered in the chip hardware. The present invention evaluates a user's logic diagram in comparison to resources available on a particular chip and matches a plurality of features in the design to resources in the chip which can efficiently implement those features.

6 Claims, 14 Drawing Sheets

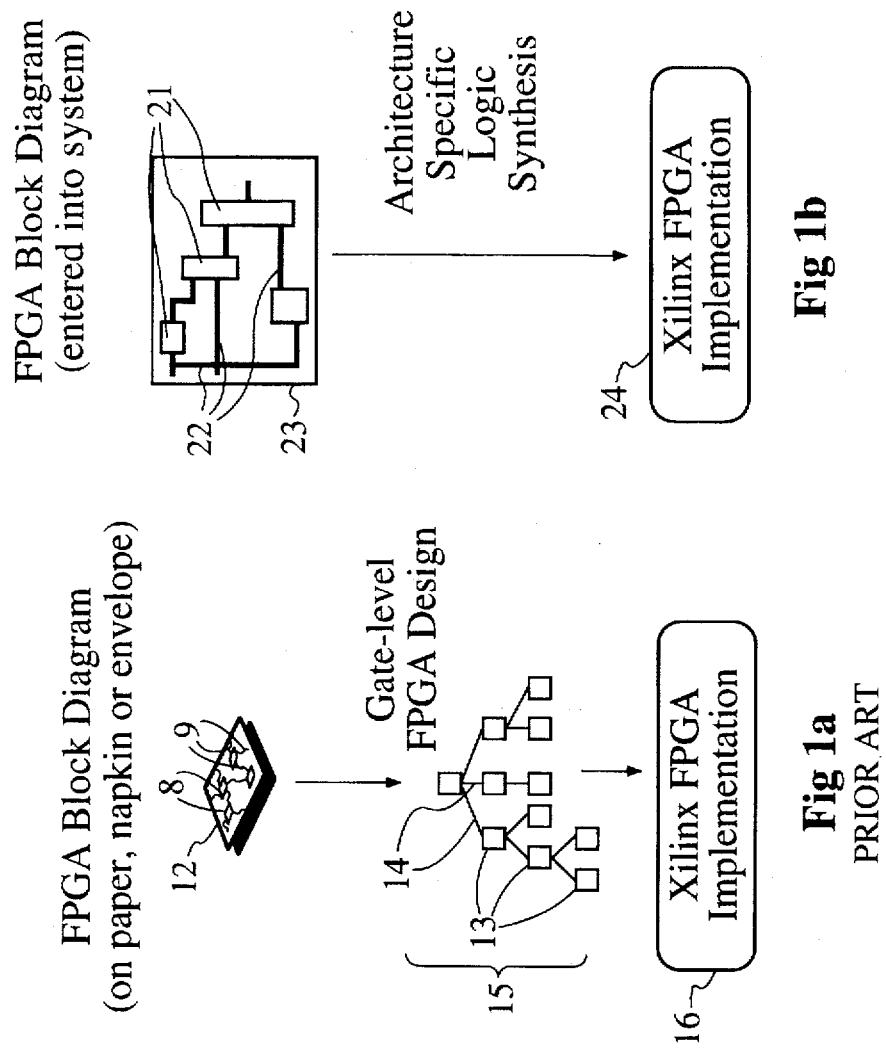

Memory
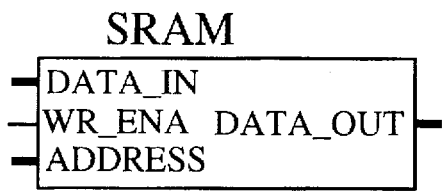
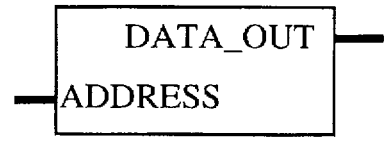
DATA=
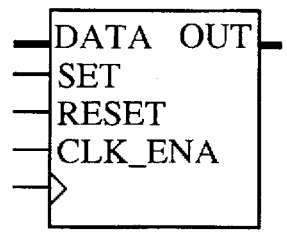
SET=
RESET=
Fig. 2d
Sequential
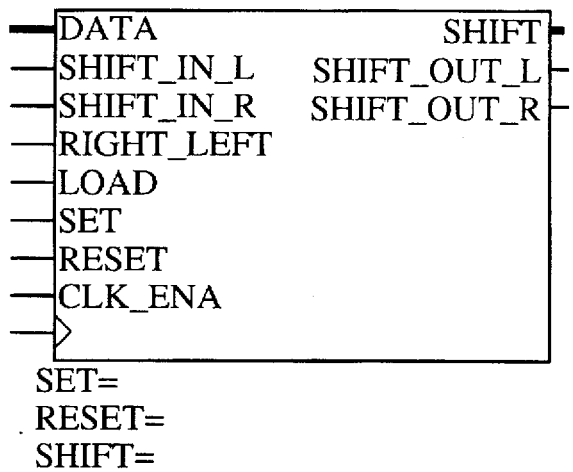
SET=
RESET=
SHIFT=
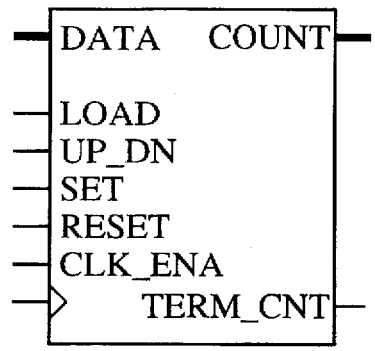
SET=
RESET=
SEQUENCE=
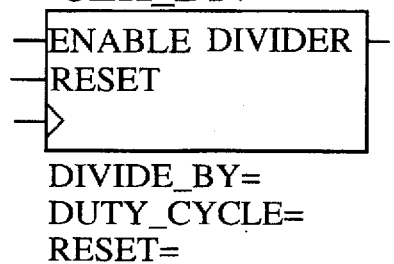
DIVIDE_BY=
DUTY_CYCLE=
RESET=
Fig. 2e 5,737,234

METHOD OF OPTIMIZING RESOURCE ALLOCATION STARTING FROM A HIGH LEVEL BLOCK DIAGRAM

This application is a division of application Ser. No. 08/303,295, filed Sep. 8, 1994 now U.S. Pat. No. 5,553,001, which is a file wrapper continuation of Ser. No. 07/784,842 filed Oct. 30, 1991.

FIELD OF THE INVENTION

The invention relates to computer aided engineering, more particularly to entry of information about a circuit design into a computer for simulating and verifying the design or implementing the design in a user programmable logic array chip.

RELATED APPLICATIONS

The present invention relates to inventions described in the following copending (concurrently filed) patent applications:

1. Steven H. Kelem and Steven K. Knapp, METHOD FOR PROPAGATING DATA TYPE IN A HIGH LEVEL CIRCUIT DESIGN, U.S. Pat. No. 5,422,833.
2. Jorge P. Seidel and Arun K. Mandhania, METHOD FOR IMPLEMENTING SET/RESET SYNCHRONOUSLY OR ASYNCHRONOUSLY IN A PROGRAMMABLE LOGIC DEVICE. U.S. Pat. No. 5,337,255.
3. Jorge P. Seidel, Steven K. Knapp, Steven H. Kelem, METHOD FOR GENERATING LOGIC MODULES FROM A HIGH LEVEL BLOCK DIAGRAM, U.S. Pat. No. 5,499,192.
4. Steven K. Knapp and Jorge P. Seidel, METHOD FOR MAPPING FUNCTIONS STARTING FROM A HIGH LEVEL BLOCK DIAGRAM, U.S. Pat. No. 5,574,655.

The above applications are incorporated herein by reference.

BACKGROUND OF THE INVENTION

Users typically design logic circuits using a computer with a schematic capture computer program or a hardware description language (HDL). The program allows the user to place symbols onto a computer screen and interconnect the symbols to indicate a circuit diagram, or to describe circuits and connections using textual description. The computer then captures the schematic diagram or logic design. Schematic capture and HDL entry are processes of converting a schematic drawing or text file generated by a user into a format which can be processed by a computer. Schematic capture and HDL software packages make it possible for a user to communicate the design to a computer conveniently. A schematic capture package typically converts the interconnected set of functional components to a net list (list of components and interconnections between these components) which can be further manipulated by other computer programs to perform a function desired by the user.

Typical schematic capture packages have included a library of primitive components, such as Boolean AND, XOR, flipflop, etc., which the user may place onto a computer display and interconnect with lines to form a logic design. However, users frequently think in terms of high-level functions to be performed, for example, counters, adders, registers and multiplexers. Entering a design directly in terms of the higher level logic operations the user intends to perform is more convenient and intuitive for a user than entering the logic design in terms of primitive AND, flipflop gates, etc.

Designing With Bus-Wide Functions

Users frequently design with bus-wide functions. For example, when a user manipulates a 10-digit number, the digits of the number are placed on a bus and are processed (added, compared, stored) as multi-bit numbers. In the past, the user may have been required to perform repetitive operations to generate the logic for processing the multiple bits. If the precision of the arithmetic to be performed changes, the user must then redesign a circuit to change the width of the bus. Such activities become tedious and time-consuming for the user. It is desirable to perform repetitive operations automatically.

Certain high level arithmetic functional components such as adder, register, and counter are frequently used. Related patent application filed concurrently with the present application, entitled METHOD FOR GENERATING LOGIC MODULES FROM A HIGH LEVEL BLOCK DIAGRAM, U.S. Pat. No. 5,499,192 describes a method for implementing certain high-level functional components directly input by a user in a logic array chip without involving the user in the intermediate step of generating primitive functional components.

Resource Allocation

The eventual placement of the elements of a logic design into a chip which will implement the design depends upon the resources provided in the chip and the distribution of these resources. For efficiency it is important that the resources of the chip be considered in allocating logic of the design into the chip. This consideration is particularly important when the chip has different kinds of resources in different parts of the chip. Such a chip is particularly difficult for a new user to use efficiently. For example, around the perimeter of Xilinx logic array chips are input/output blocks with tristate buffers each connected to an external pin. Also provided at each corner of some of the Xilinx chips are clock buffers (high gain buffers) and oscillators. Extending throughout the Xilinx chips are a few conductive lines for carrying wide-fan-out signals, such as clock signals, to parts of the chip as needed.

When allocating the user's logic to portions of a chip, it is most efficient to take into account the particular resources provided on the chip, so that the logic functions can be computed at high speed, the area needed can be minimized, and the greatest amount of logic can be packed into a chip of a given size. For example, it is most efficient to drive wide fan-out signals from clock buffers and onto the long lines intended for clock signals, thereby providing a clock signal to all parts of the chip with low skew. Likewise, it is most efficient to place registers which hold output signals near the output pins they will drive.

Prior art automatic methods for resource allocation have not been able to take into account that different portions of the chip can most efficiently implement different parts of the user's logic. Prior art automatic methods have not included automatic methods for matching features in a logic design with features in a programmable logic device intended for implementing particular logic design features. And prior art methods have not been able to detect matches between the user design and the chip resources, and transform the design to implement the matches.

SUMMARY OF THE INVENTION

According to the present invention, a method is provided for allocating a user's logic to portions of a chip which can implement that logic most efficiently. Methods are provided by which specific resources of the chip which will implement the logic can be accounted for in algorithms which assign logic to the chip. Resources which are to be taken into account are itemized in the allocation logic. Aspects of the user's logic are checked for compatibility with the special resources. When a match is found, an attribute is attached to that logic element in the user's design. Then when the element is encountered during the partitioning, placement, and routing steps to follow, the attribute causes the partitioning and placement algorithms to place the logic where it is most efficiently implemented.

BRIEF DESCRIPTION OF THE DRAWINGS

FIG. 1a shows a representation of a prior art method of designing a logic circuit.

FIG. 1b shows a representation of several novel steps of designing a logic circuit for which the present invention plays a part.

FIGS. 2a–2h show bus-wide logic functions which can be used with the present invention.

DETAILED DESCRIPTION OF A PREFERRED EMBODIMENT

Figure 2A:
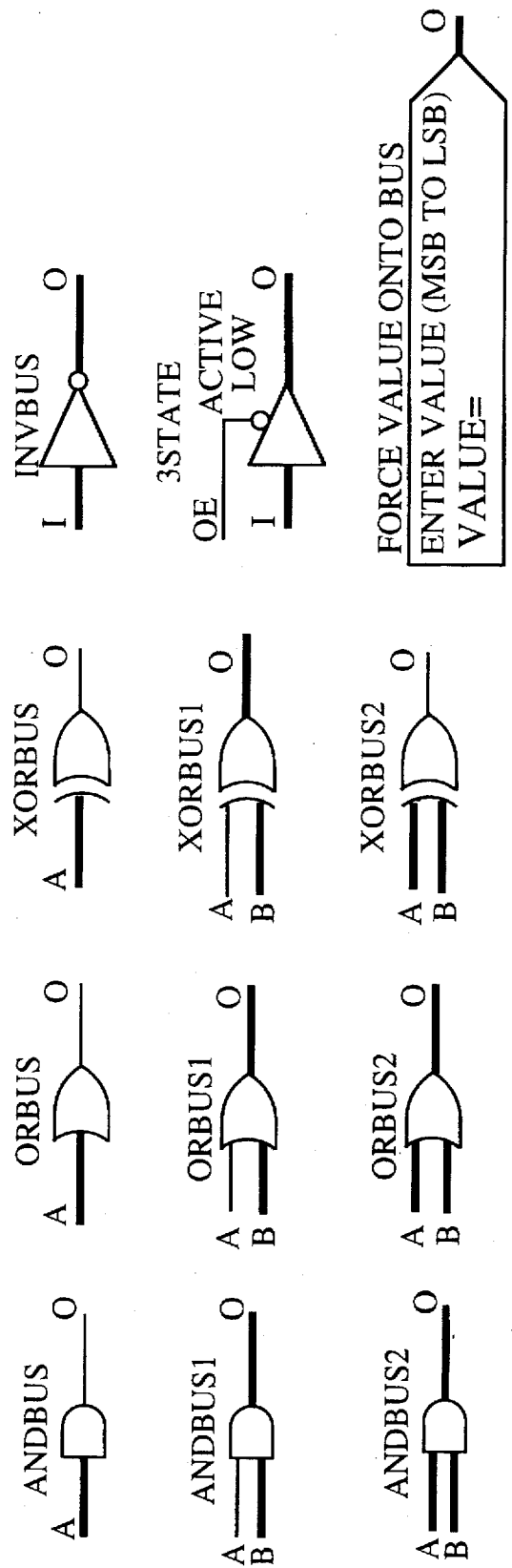

The resource allocation method of the present invention allows a user to design with high-level logic functional blocks and implement the design in field programmable gate array chips.

FIG. 1a represents a prior art method of designing, in which the user made a drawing on paper 12 of a block diagram of a logic design, typically showing functional blocks 8 and interconnect lines 9. The user would then use a computer with CAE (computer aided engineering) software to represent the design 15 in terms of logic gates 13 and interconnect lines 14. Finally, this logic gate design 15, which had been laboriously generated, was converted to a programmed part 16, for example a Xilinx FPGA.

FIG. 1b represents the simplified process available with the present invention. A designer enters a block diagram 23 using a schematic editor such as FutureNet™, Cadence™, VIEWlogic™, OrCAD™, Mentor™ or another. A schematic editor allows the designer to represent the logic design as a schematic diagram using symbols on a computer monitor screen, and to draw lines on the computer screen between functional components to indicate the interconnections. The same can be done with hardware description languages. The present invention adds high-level symbols to a library available through the schematic editors. Automatically, the software of the present invention determines from the user's high-level block diagram or description 23 the equivalent cells in a field programmable gate array chip needed to implement the design. The user is relieved from having to perform the tedious step 15 of generating a gate-level design. Further, the translation of each functional block 21 can be optimized for the architecture and the optimized translation implemented in response to the user's designation of the functional block.

Figure 2B:
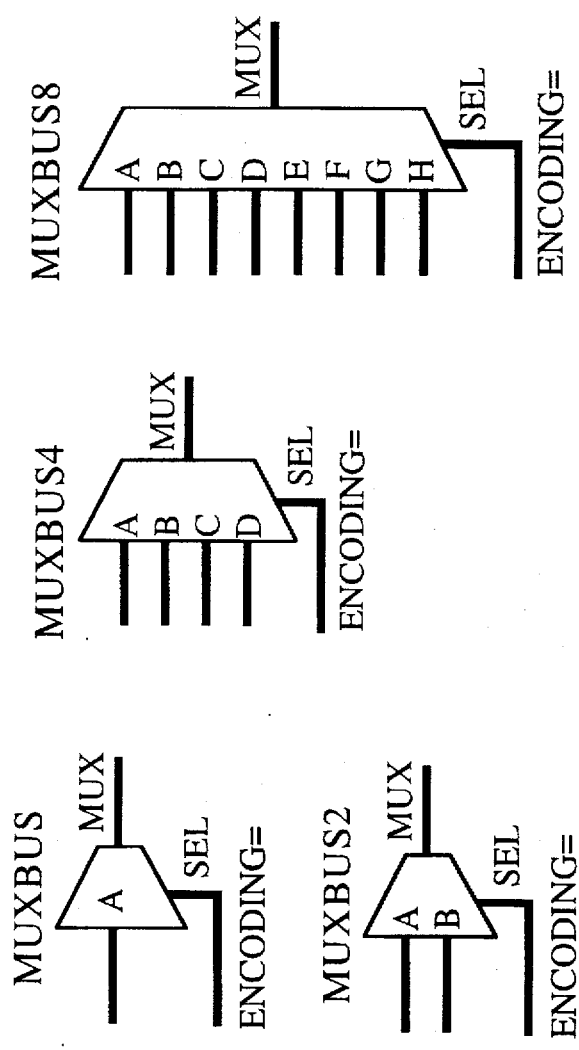
Figure 2C:
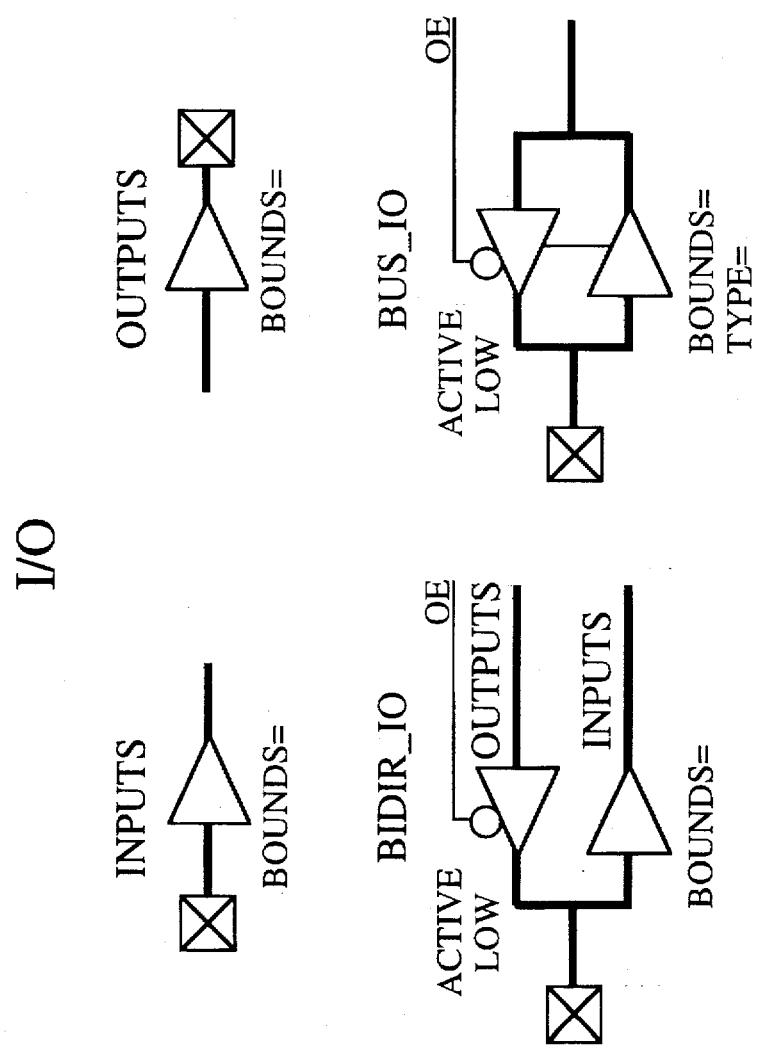
Figures 2F, 2G:
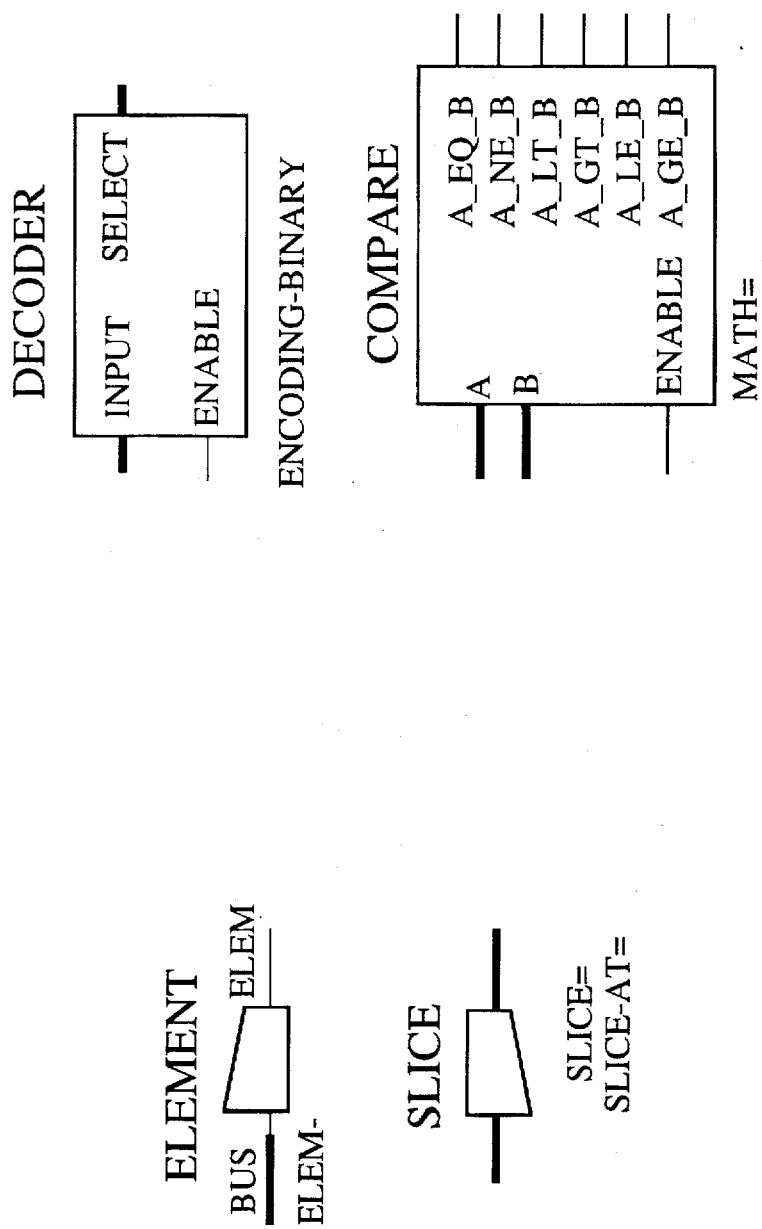
Figure 2H:
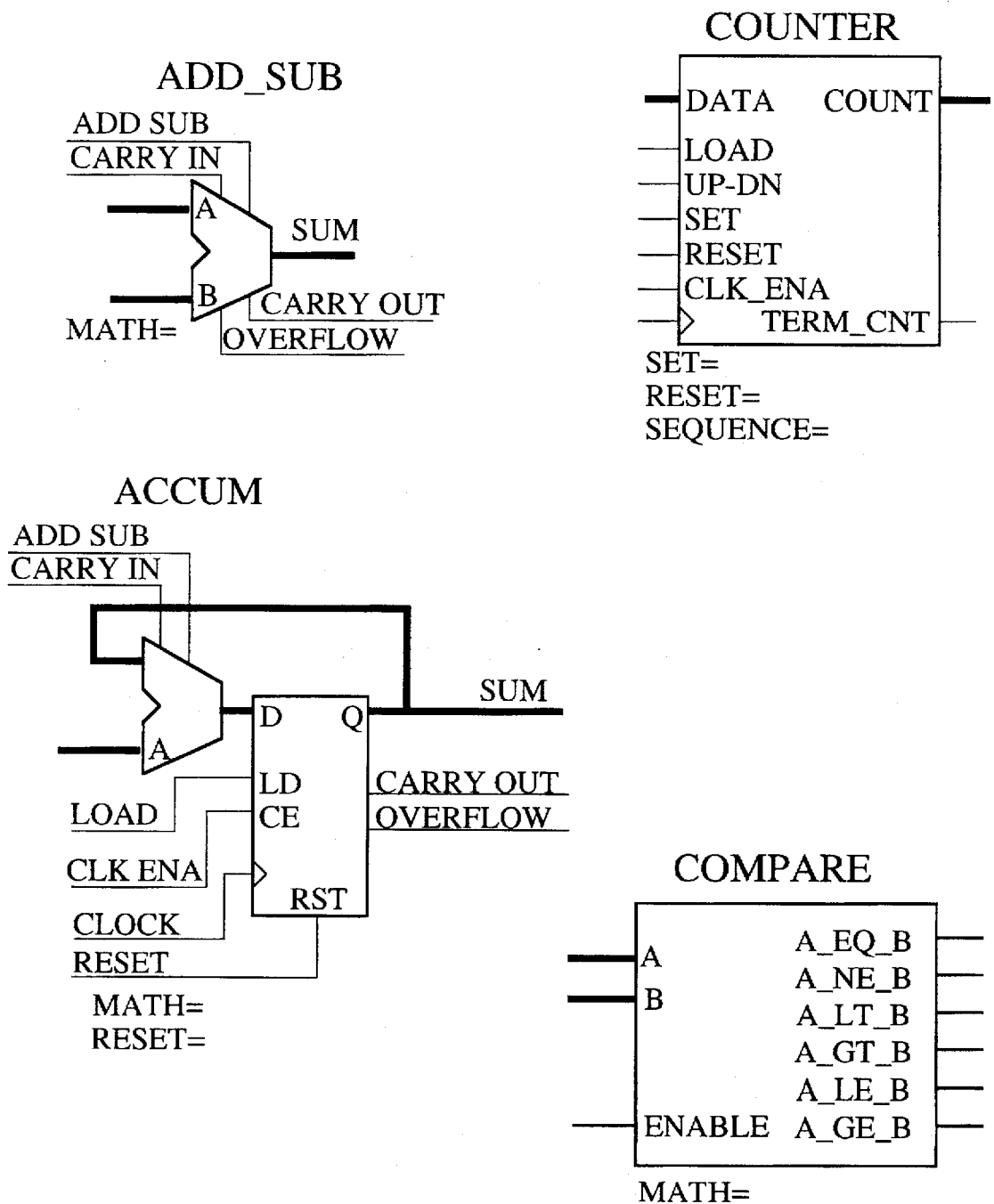

FIGS. 2a–2j show a set of graphical functional blocks in a library available to a user for entering a high-level block diagram. Hardware description blocks, not shown, can also be provided. The library associated with the method of the invention preferably includes a complete set of Boolean functions and flip flops as well as high-level functions. Lower level bus-wide Boolean functions are shown in FIG. 2a. A set of bus-wide multiplexer functions are shown in FIG. 2b. Bus-wide input/output functions are shown in FIG. 2c. Memory functions are shown in FIG. 2d. Sequential functions are shown in FIG. 2e. Bus-dividing functions are shown in FIG. 2f. Decode and compare functions are shown in FIG. 2g, and arithmetic functions are shown in FIG. 2h. These functional blocks are further discussed in U.S. Pat. No. 5,499,192, incorporated herein by reference.

Figure 3:
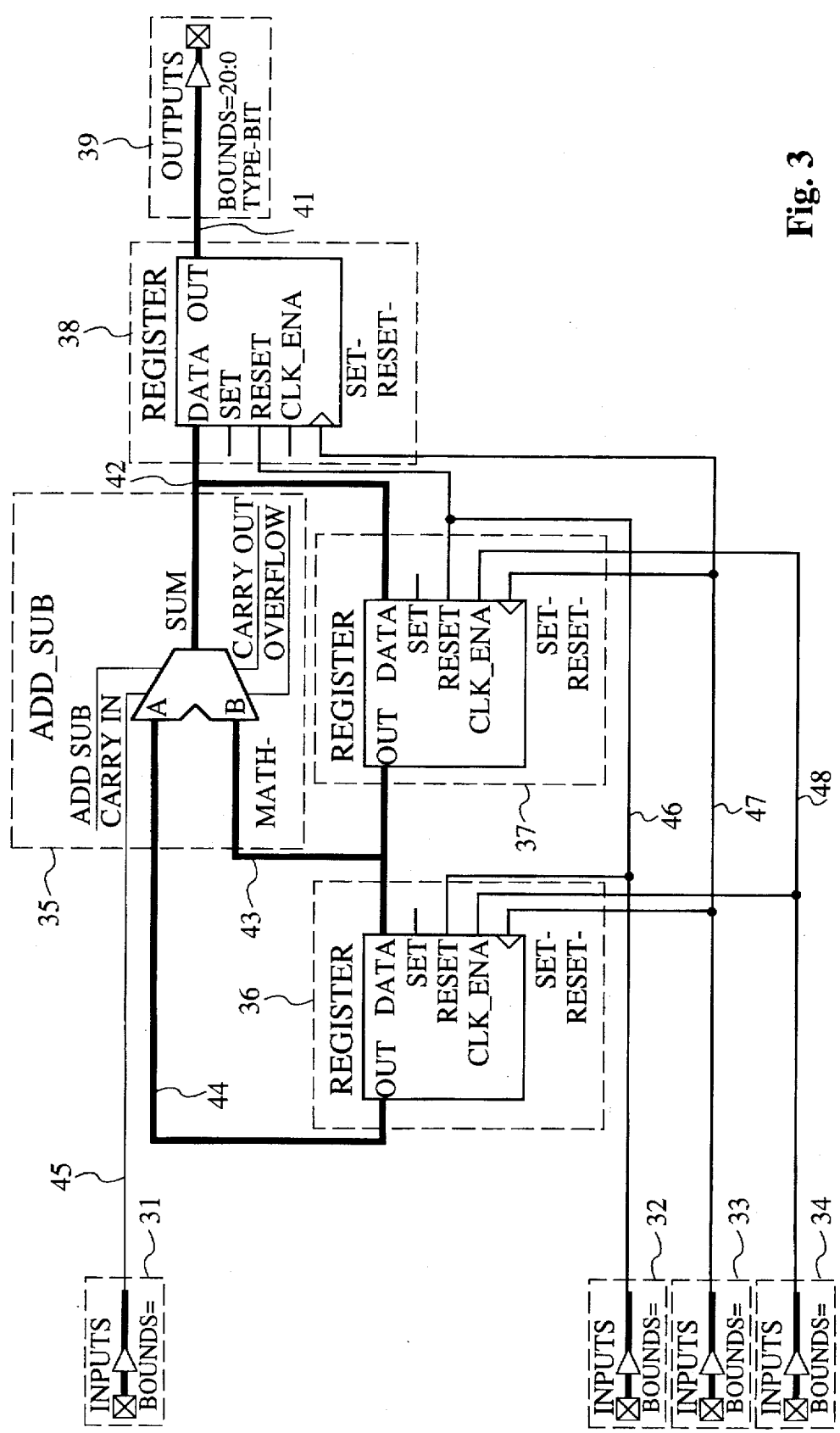
FIG. 3 shows a block diagram of a Fibonacci number generator which illustrates the use of the present invention.

These functions can be called up by a user of a schematic capture program to form a block diagram such as the Fibonacci number generator shown in FIG. 3. The user has specified four INPUT blocks 31–34, one ADD_SUB block 35, three REGISTERs 36–38, and one OUTPUTS block 39. The user has specified that the blocks will be interconnected as shown with buses 41–48 to form a Fibonacci number generator. The user has specified that INPUTS blocks 32, 33, and 34 will connect through buses 46, 47, and 48 respectively to RESET, clock, and CLK_ENA ports, respectively, of REGISTERs 36, 37, and 38. The user has further specified that OUTPUTS block will have a BOUNDS ranging from 20 to 0, which means 21 output pins will be needed. As discussed further in U.S. Pat. No. 5,422,833, incorporated herein by reference, bus 41 will be set to have a width of 21, register 38 will be set to have a width of 21, bus 42, register 37, bus 43, register 36, and bus 44 will be set to have a width of 21. ADD SUB block 35 will be further set to have a width of 21 on its A, B, and SUM terminals. Sufficient chip resources must be provided for each of these functional blocks and buses. Further, since buses 46, 47, and 48 are specified to connect to single-bit ports of REGISTERs, buses 46–48 are set to be one bit wide (to be a single line each).

Steps in the Overall Flow of High-level Block Diagram Implementation

Figure 4:
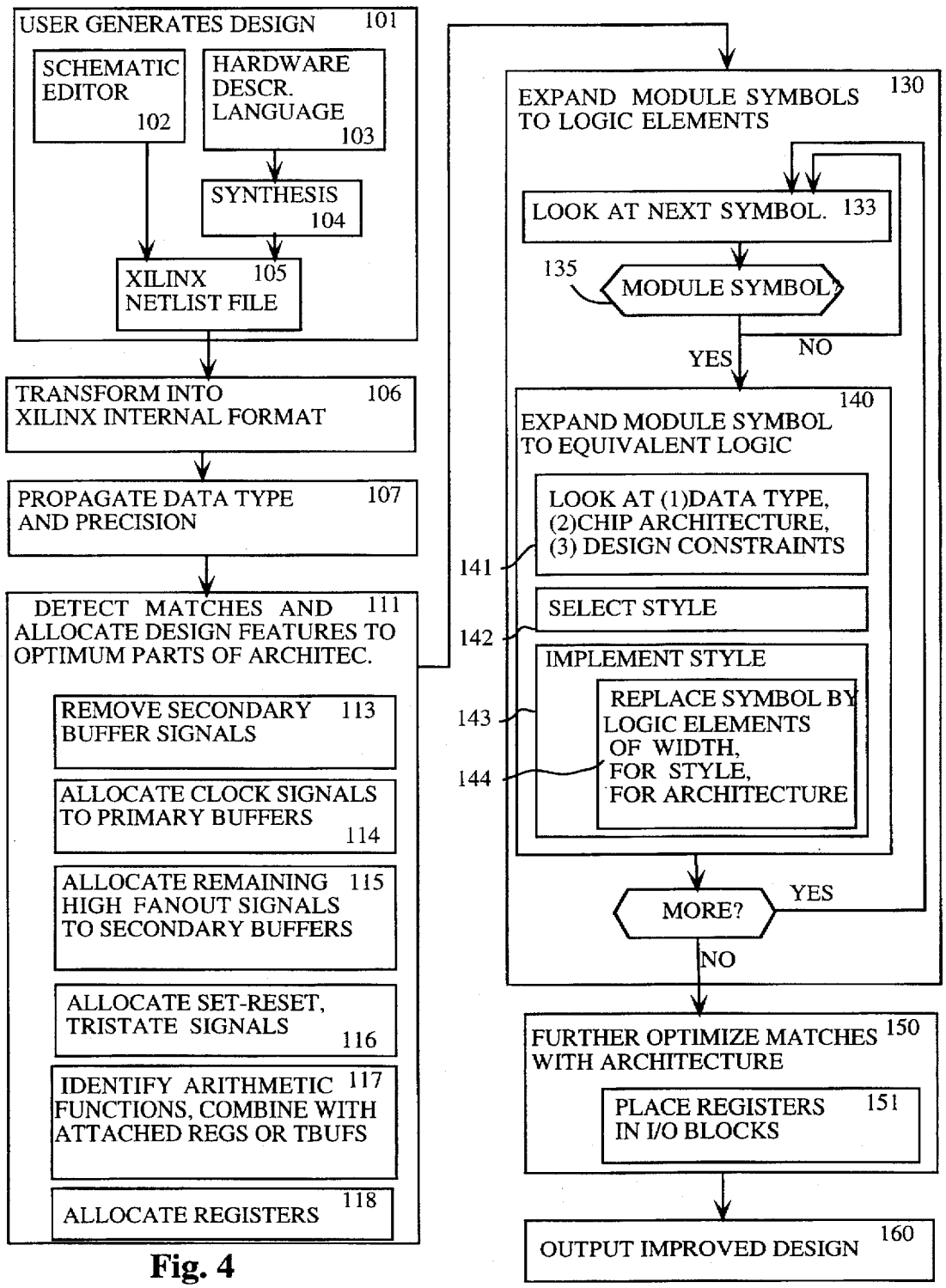
FIG. 4 shows a flow diagram for implementing a high-level block diagram in a logic array chip, of which the present invention is a part.

FIG. 4 shows the steps for converting the user's design to a design which can be efficiently placed and routed into a field programmable gate array chip. The following steps are discussed in terms of a graphical description of a logic design. Similar steps are performed for a hardware description language representation of a logic design.

In step 101, the user generates the logic design. The user may generate a design either as represented in step 102 by using symbols displayed on a computer monitor by a schematic editor, or as represented in step 103 by typing descriptions of the functional blocks to be used and their connections to each other. In step 104, the description is synthesized. In either method, the user must provide certain additional information including data type and precision of bus-wide functions. The design is preferably read and displayed to the user as each element of the design is entered. FIG. 3 shows such a computer screen representation. If the functions desired by the designer are supported by a high-level library symbol and corresponding master template for the function (set of instructions for interpreting the functional block symbol), the designer may represent that function by a simple block in the schematic diagram. A user may represent high-level functions not supported by a master template by primitive Boolean functions such as shown in FIG. 2a. In step 105, the user's design is stored as a Xilinx netlist file, that is a file of functional elements, interconnections, data types, and other information which completely specify the design in a format which can be used in the steps to follow. (A netlist is a list of symbols and the lines which interconnect the symbols. It corresponds to the symbols and interconnections shown in the schematic diagram entered by the user.)

In step 106, the user's information is transformed into an internal format for representing the design. This XIF format information is referred to below as the graph of the circuit design. As each step in implementing the design is carried out, the program updates this graph. This XIF format is convenient for the operations which follow.

Removing Unnecessary Symbols

Next a graph modification is performed to remove unnecessary symbols from the graph. This procedure will look at every symbol in the graph. If a symbol can be deleted because it does not contribute to the meaningful signal flow in the graph, it will be deleted. Otherwise, if a symbol is missing a required input signal, a dummy signal is created and the designer is notified. The dummy signal may be attached to either VCC or GND, depending upon the TYPE of the symbol.

An example of a symbol that would result in this type of graph modification would be symbols that have input pins that require signals to generate outputs, but have no signals attached to those input pins. Another would be a symbol that has output pins that show the result of the operation performed by that symbol, but has no signals attached to those output pins.

Figure 6:
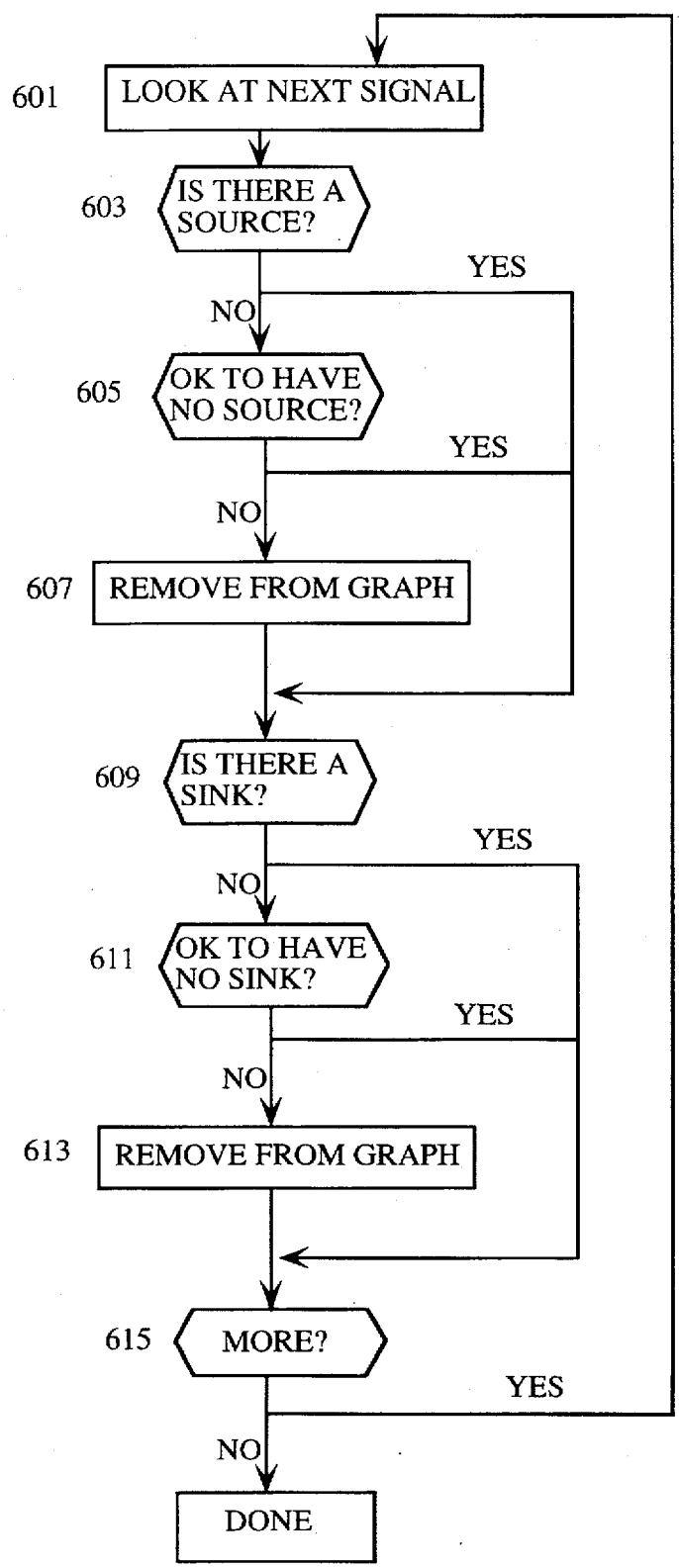
FIG. 6 shows the logic flow for logic trimming.

The basic algorithm used in this logic trimming operation is shown in FIG. 6. Each symbol in the graph is examined at step 601, in turn. As shown in step 603, if the signal has no source, this lack is tested at step 605 for acceptability. If it is not acceptable for the signal to have no source, at step 607 the signal is removed from the graph. Likewise, at step 609, the signal is examined for a sink, and at step 611 for whether this is acceptable. If this is not acceptable, the signal is removed. If the signal has a source or if it is acceptable for the signal to have no source, and if the signal has a sink or it is acceptable for the signal to have no sink, no adjustment to the graph occurs and the procedure moves to the next signal.

Data Type Propagation

As further described in related U.S. Pat. No. 5,422,833 also assigned to Xilinx, Inc, entitled METHOD FOR PROPAGATING DATA TYPE IN A HIGH LEVEL BLOCK DIAGRAM, [docket M-1792], in step 107, the information provided by the user on data type and precision is propagated to all appropriate parts of the logic design, thereby saving the user from having to perform this step repetitively. Precision refers to the number of digits in an arithmetic quantity. If the data type is binary or hexadecimal or another type where one digit represents one bit, the precision is the same as the bus width. If the data type is BCD, each digit is represented by 4 bits and the bus width is 4 times the precision.

Where the Present Invention Fits into the Flow

After data type propagation step 107 is complete, the method outlined in FIG. 4 proceeds with step 111, allocating design features to appropriate chip resources. This step is the subject of the present invention. In step 111, parts of the design are marked to be assigned to types of resources of the field programmable gate array chip which will implement the design. It is in this design feature allocation step that the requirements of the design are matched with the architectural characteristics of the physical chip to make more efficient use of the resources on the chip. A different chip architecture would need a different allocation of resources to implement the same design efficiently.

Steps in Allocating Design Features, First Cut

A preferred embodiment of the invention is used with Xilinx 4000-series chips. The steps performed in this preferred embodiment of the present invention to allocate design features to resources in the chip intended for those features include:

- step 113 of removing secondary buffer signals which the user may have unwisely assigned,
- step 114 of allocating clock signals to primary buffers which feed only clock lines of flip flops,
- step 115 of allocating high fanout non-clock signals to secondary buffers which feed long lines that can connect to any port,
- step 116 of allocating set/reset signals to buffers and long lines that feed set and reset lines of flip flops only, and
- step 117 of identifying arithmetic functions and combining with attached registers and tristate buffers where possible
- step 118 for registers which are specified to connect to external pins, allocating these registers to input/output blocks on the periphery of the chip.

These first cut steps of allocating resources are explained in further detail below.

Subsequent Steps

Before logic functions represented in the designer's block diagram can be placed in the logic array chip, the logic functions indicated in block diagram form are expanded to their full width. A function indicated by an adder symbol, for example, with a 16-bit output bus is replaced by 16 1-bit adders with carry functions interconnected to form the 16-bit adder. The 16-bit bus connected to it is replaced by 16 lines connecting to each of the 1-bit adders plus elements which connect the line to its place on the bus. If the bus connects to another function, say, a 16-bit register, the register is replaced by 16 1-bit flip flops. The connection from the register to the bus is replaced by 16 lines each with an element connecting the line to its place in the bus. U.S. Pat. No. 5,499,192 filed concurrently herewith, entitled METHOD FOR GENERATING LOGIC MODULES FROM A HIGH LEVEL BLOCK DIAGRAM describes this portion of the logic flow. Arithmetic functions, especially wide arithmetic functions, are expanded using hard macros. A hard macro specifies the implemlntation of a high-level function in a fixed bus width, with specified interconnections between logic blocks and specific configurations of each logic block which implements the function. A hard macro can not be subsequently modified. The performance is predictable, and optimized for implementing the specific function in the particular hardware. (Soft macros are also available with fixed bus width but flexible placement, and routing.)

In step 130, the hard macro expands a high-level function to occupy a specific portion of the logic array chip (or several chips). The expanded logic circuit elements are recorded in a net list format in an XNF file. Arithmetic functions, especially wide arithmetic functions, may be marked during module generation to use the fast-carry feature if the logic of the method determines that a fast carry method will require less chip area or be faster than ripple carry.

An advantage of marking the functional blocks with attributes in step 111 before expanding the functional blocks to their bus-wide equivalents in step 130 is that bus-wide functions must only be evaluated and marked once, thus saving computer (and user) time which would be spent evaluating and marking every line on a bus.

Step 130 includes grouping certain block diagram symbols. For example in the Fibonacci generator of FIG. 3, register 38 and outputs block 39 are grouped to be implemented in input/output cells, thus freeing lines which would have been needed for bus 41 for other use, and freeing logic blocks which would have been needed for flip flops to implement register 38 for other use.

Because of this module expansion step 130, step 150 is included to achieve further matching of design features with the available resources in the chip architecture.

As a final step 160, the improved design, which includes functional blocks allocated to particular resources available in the chip architecture, is output in a file which can then be placed and routed to configure the logic array chip.

Use with Xilinx-4000 Architecture

The following description covers an embodiment of the invention which optimizes placement of a user's design in Xilinx 4000-series field programmable gate array chips. These 4000-series chips offer several resources intended for special purposes:

- primary clock buffers, each of which feeds a line which extends throughout the chip but connects only to clock inputs of flip flops in the chip,
- secondary buffers, which feed a line extending through the chip but can be connected to inputs of the user's choice
- global three-state buffers, several of which connect to a single long line extending through the chip,
- arithmetic fast carry circuitry, which is hardwired to generate a carry output and which can be easily connected to carry input ports on adjacent cells, and
- input/output buffers which include a flip flop, and which can be connected to external pads.

For each of these resources the present embodiment evaluates the user's logic design and places logic such that the above resources are efficiently used.

Figure 5:
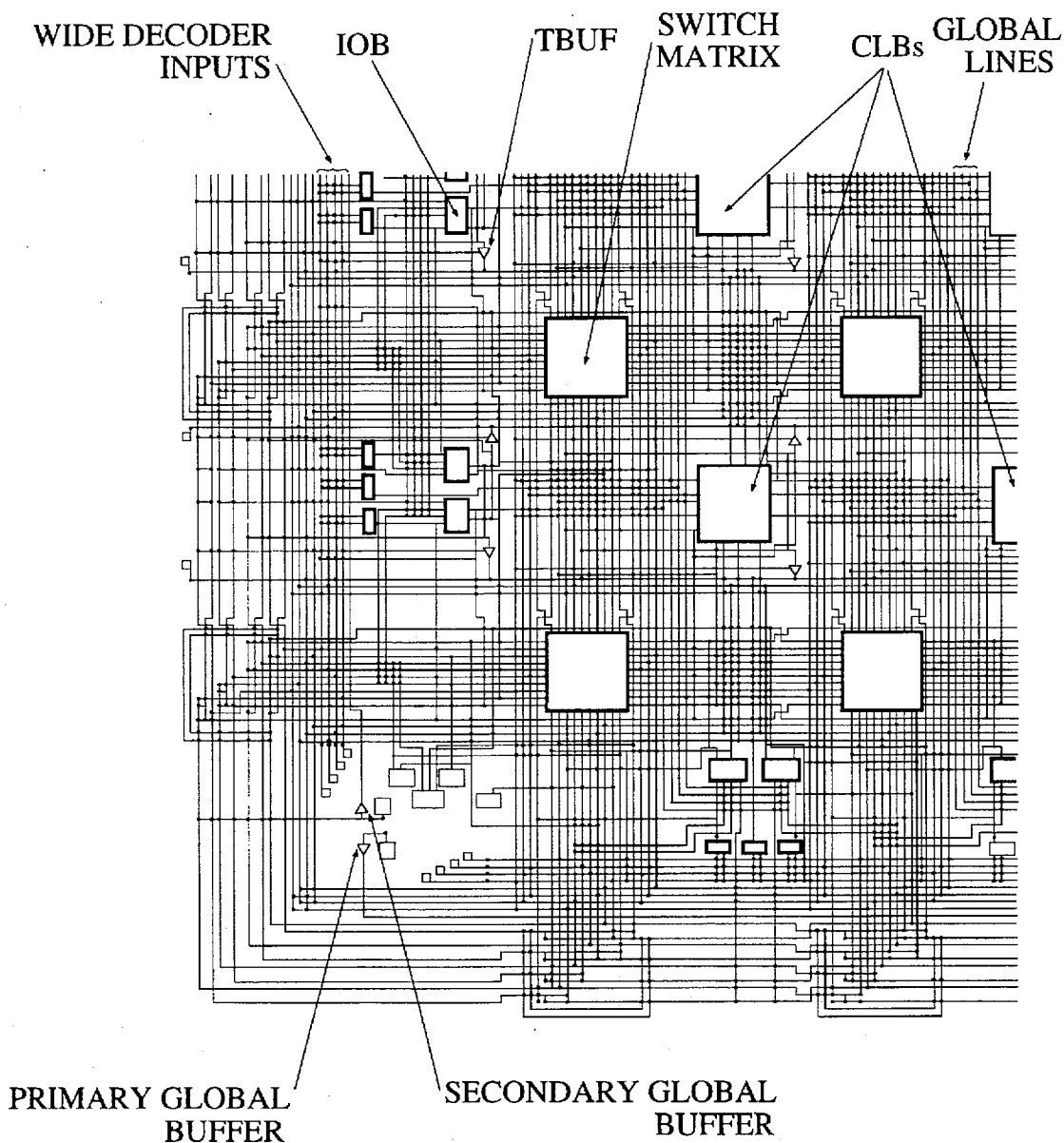
FIG. 5 shows a portion of a Xilinx XC4000-series logic array chip which can be configured to implement a high-level design such as shown in FIG. 3 using the method of the present invention.

FIG. 5 shows a portion of a Xilinx 4000-series field programmable logic array chip which can be advantageously programmed using the methods of the invention. Such chips are further described in the Xilinx Technical Data book entitled XC 4000 Logic Cell™ Array Family.© 1990 by Xilinx, Inc., and available from Xilinx, Inc. 2100 Logic Drive, San Jose, 95124, and incorporated herein by reference. These 4000-series chips include logic blocks in the interior of the chip each of which include both combinatorial and sequential elements, and which include a fast carry circuit for implementing arithmetic functions in adjacent logic blocks. At the perimeter of the chip are input/output (I/O) blocks tied to external pins of the chip which include bidirectional input/output buffers and sequential elements. Also provided on the chip are several high drive low skew buffers for driving high fan-out signals such as global clock and reset signals. (Skew is the difference between maximum and minimum delay between when a signal placed on a line reaches multiple destinations. Skew becomes large when a signal must pass through zero or few transistors before reaching one destination but through several pass transistors with concommitant RC delay before reaching another destination.) The chip includes interconnect lines of both short and long length, short for interconnecting nearby elements, and long for interconnecting elements in distant parts of the chip or for interconnecting multiple elements. In addition, the chip includes one or two clock and reset lines which extend throughout the chip and do not pass through intermediate transistors. These clock and reset lines therefore have very low skew. They are of course preferred for carrying clock and reset signals because of the high fanout ability and low skew.

Steps Used in the First Cut Allocating of Design Features, Preferred Embodiment The preferred embodiment discussed below operates with Xilinx XC4000-series FPGA chips. These chips include global primary buffers, global secondary buffers, global set/reset buffers, and global tristate buffers each of which is attached to a globally extending line in the chip and each of which can support high fanout signals. Global primary buffers (BUFGPs) can only attach to clock pins of flip flops in logic blocks of the chip. Global secondary buffers (BUFGSs) can attach to both clock and logic pins. However, no more than two lines with many logic connections should be connected to BUFGSs.

Graph Modifications

A graph is maintained in conjunction with the XNF file and provides a symbolic representation of the Xilinx net list file. The graph is updated every time the program makes an architectural optimization and every time a module is expanded. Since the graph will be modified at various times and for various reasons, graph modification will be called throughout the optimization procedure as necessary.

Evaluating and Deleting Signals on Global Secondary Buffers

Global secondary buffers may be thought of as the most valuable buffer resources on the chip. They are both fast and general purpose. However they occupy enough chip area that only four are provided on the currently available chips. Thus they should be used wisely.

It is possible that clock signals and minor signals have been assigned by a user to global secondary buffers. Since the Xilinx 4000-series chips have dedicated clock buffers and clock lines, clock signals could be better assigned to primary clock buffers. Likewise, global asynchronous set-reset signals would be better assigned to global set-reset buffers and lines. In the present XC4000-series, one such set-reset (STARTUP) buffer is provided, and should be used if called for. Signals with small fanout could be better assigned to other general purpose chip resources. The rule of Step 113 evaluates each signal currently assigned to global secondary buffers and if it meets the criteria for promotion or demotion, removes it from the global secondary buffer and places it on an ordinary buffer for examination later. Signals initially specified as attached to a global secondary buffer are checked three times, first to determine whether they qualify for the set/reset STARTUP buffer, second to determine if they qualify as a global tristate signal, and third to determine if they could be placed on a global primary buffer. If a signal does not qualify, the next signal in the netlist is checked.

To replace the global secondary buffer attribute with an ordinary buffer attribute, the new buffer is added to the netlist, then the input signal is moved to the input buffer and the output signal remains the original output signal of the global secondary buffer.

Assigning Global Primary Buffer Attributes

The purpose of this rule, shown at step 114, is to maximize utilization of Global Primary Clock Buffers ('BUFGP'). These buffers provide a performance edge when used with clock signals that are widely distributed on the chip. The first information needed is how many global primary buffers are already being used. Since there may already have been changes to the graph (an internal version of the netlist, which is updated as changes are made), we need to ensure that the symbols we think are on global buffers are still in the graph. The signals that are output from existing global primary buffer symbols are not candidates for assignment to global primary buffers since they are already buffered. All signals that are high-fanout clock signals are considered for assigning to global primary buffers. In the present embodiment, only clock signals can attach to global primary buffers. The value for high-fanout is kept in a defaults file. The List_by_fanout contains all signals with fanout greater than the default value.

The candidate signals are high-fanout signals that are not currently attached to global buffers. First, the number of global primary buffers already in use is checked to see if there are any available global primary buffers. If there are any primary buffers available, then each candidate signal is examined to see if it goes to only clock pins.

If both of those conditions are met, then we have a candidate signal for a global primary buffer. We display this to the user. If either of the conditions required to assign the signal is not met, then no change is made to the graph and no change is displayed to the user.

Figure 9A:
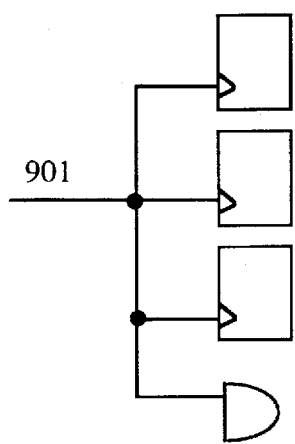
FIGS. 9a and 9b show the logic division used with global primary buffers.
Figure 9B:
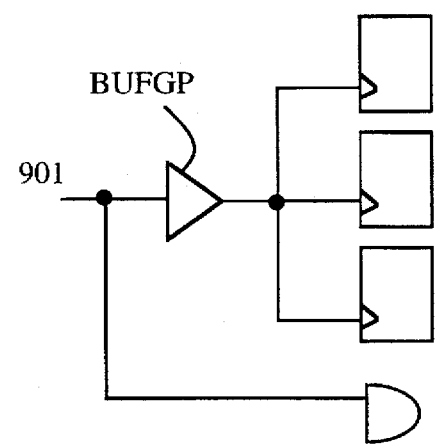

Many high-fanout signals that are candidates for global buffers have mixed clock and logic pin connections. One logic pin connection among many clock pin connections might make such a signal unavailable for using the global primary buffer. Better resource allocation is achieved by splitting candidate signals into their clock and logic connection components. The situation is illustrated in FIGS. 9a and 9b. FIG. 9a illustrates a logic design as supplied by a user. High fanout line 901 connects to both clock and logic inputs. No buffer is shown connecting the high fanout line 901 to the clock inputs. However, a buffer will result in a faster signal and placing the signal on a global long line will result in lower skew. Since the global primary buffer connects only to clock pins, a signal which drives 200 clock pins and only one logic pin can not use the global primary buffer. Therefore, the method of the invention recognizes such an arrangement, and as shown in FIG. 9b, the logic inputs are separated from the clock inputs, and the clock inputs are then candidates for the global clock buffer.

Assigning Global Secondary Buffers

The rules and procedures at step 115 for allocating signals to global secondary buffers are similar to the rules and procedures for allocating to global primary buffers, except that no rule requires the signals to go only to clock inputs. The procedure for assigning global secondary buffers returns all high-fanout signals greater than a built-in minimum high_fanout_value starting with the signal with the largest fanout, then succesively smaller fanouts. Candidates for primary clock buffers which were not assigned to primary clock buffers are candidates for secondary buffers. Of the clock line candidates, we attach the clock line with the highest fanout to a primary clock buffer. If there are more than four qualified primary clock buffer candidates, some are candidates for global secondary buffers.

There is a need to look at the true fanout of a signal. Since the functional block symbols often involve buses, the fanout of a particular symbol depends on whether each sink (each input port fed by the fanout signal) will be duplicated when bus expansion is done. If so, the fanout is multiplied by the bus width. Knowledge built into the program includes information about the type of symbol that is currently being examined.

For each of the Xilinx BLOX symbols that has fanout pins, the pins are split into three categories: pins that fan out, pins that are buses and therefore do not fan out, and pins that are neither. Only the first two categories are listed; the remaining pins can be inferred.

Once a list of signals is generated it can be compared to the list of signals that are already buffered. Those candidate signals not already buffered are returned as candidates.

To maximize utilization of the global secondary buffers, the program searches for symbols that are already assigned to global secondary buffers. Ideally, all four global secondary buffers will be used if needed. If there are less than four used, the method searches for any clock signals not already attached to either a global primary or a global secondary buffer. For the global secondary buffer, these candidate signals can attach to both clock inputs and to other logic inputs. This search is repeated until all four of the global secondary buffers are used or until there are no more candidate signals.

STARTUP Symbol

A STARTUP symbol is used by the program to indicate when a signal entered by a user qualifies as either a global set/reset signal or a global tristate signal. The symbol includes separate inputs for set/reset and tristate. If a signal goes to all symbols that have set/reset pins (flip flops), and is assigned to the set or reset pin of that symbol, then it is examined to see if it meets the other criteria for being assigned to the global set-reset signal on a 'STARTUP' symbol. If so, then the signal is removed from the set/reset pins, and connected to the global set/reset (GSR) pin on a 'STARTUP' symbol. If the symbol has been indicated by the user as going to set/reset pins but the global set/reset input has not been used, and if other criteria are met, the program assumes the user intended a global set/reset function, and assigns this signal to the STARTUP symbol.

The Global set/reset buffer must have as its output a signal that goes only to asynchronous set/reset inputs of flip flops. Therefore signals being evaluated for placement on the global set/reset buffer must lead only to symbols that have an asynchronous control and must be connected to the asynchronous control input of the symbol.

If there are any non-set-reset signals attached to the same net as the global set-reset, the non-set-reset signals will be assigned to an ordinary buffer. If a signal attached to asynchronous control inputs on appropriate symbols has no other outputs, it will be assigned only the STARTUP symbol.

Global Set/Reset Function

At step 116, the program checks each known set-reset symbol that is connected to the given signal to ensure that the signal attaches to an asynchronous Control pin on that symbol. This ensures that every set-reset symbol is among the set of symbols attached to the given signal, and that the given signal attaches to an appropriate pin on that symbol. Modifying the graphs for the global set-reset is very different from the transformations necessary to insert a global buffer. The steps that need to be taken are Check to see if a symbol of type STARTUP already exists. If not, create it. If so, does it have a GSR pin available? If not, create it.

Connect the candidate signal to the 'GSR' input of that symbol in both the symbol and signal graphs Remove the candidate signal from all of the symbols that were sinks of that signal. Note that this leaves non-set-reset symbols still attached to the candidate signal.

To see if a design currently uses the global set/reset function, check if a symbol of type 'STARTUP' is already used with a line attached to its global set/reset input pin. If it is not used, see if it could be used. The easiest case is if the symbol doesn't exist. This guarantees that the pin is available. If the symbol is used, then we check if the pin of interest is used.

To see if it is possible to use the global set/reset buffer and line, make a list of all symbols that have set-reset pins. Find every net that attaches to all of those symbols, and check those nets to see if there is one net that attaches only to ASYNCH_CTRL pins.

The desired signal attached to the ASYNCH_CTRL input of the symbol (the name of the pin will vary). Functional block symbols will have pins called 'ASYNCH_CTRL' and 'SYNCH_CTRL', as further discussed in copending U.S. Pat. No. 5,337,255 incorporated by reference. The primitive symbols will have either a SD, RD, or GSR input.

The list of symbols that are sinks of the largest fanout signal, and the list created by finding all clocked elements must be identical for this procedure to be executed.

If these conditions of space available, high fanout, and set/reset function are met, then a new symbol of type 'STARTUP' should be attached to the net determined by this procedure. This also involves removing the net from the graph, since it has been assigned to a different resource in the chip.

Global Three-State Function

There is a single line that drives the three-state pin of Xilinx XC4000-series input/output blocks. This line is represented by the 'OUT_ENA' pin of the functional block symbols of FIGS. 2a–2h which have such a port.

Further in step 116, in order to use the global three state function associated with the 'STARTUP' symbol available in 4000 series parts, we first check if a symbol of type 'STARTUP' is already used with a net attached to its global three-state input pin. If not, we check to see if all of the outputs of a signal are three-state outputs. If both of those conditions are true, then we attach the global three-state pin on the STARTUP symbol to the global three-state input pin, and remove the connection between the signal and each output element.

Remove Redundant Buses

After the modules have been expanded in step 130, in step 150, the graph is examined to determine whether redundant buses can be removed. Redundant buses occur when functional blocks are combined. The buses which formerly connected them have been fully expanded to their corresponding elements. (This occurred in FIG. 3, for example, when REGISTER 38 and OUTPUTS 39 were combined, eliminating bus 41.)

Figure 7A:
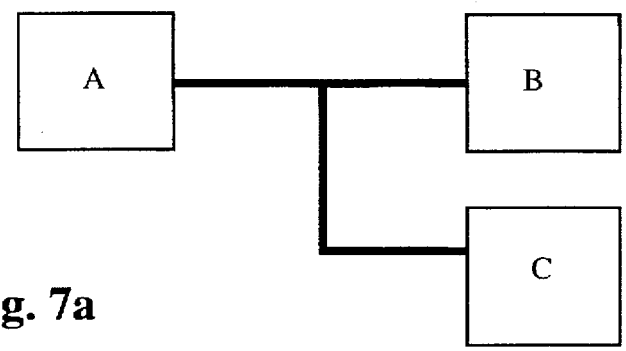
FIGS. 7a–7c show a high-level block diagram, an intermediate step in which blocks have been replaced by equivalent modules and a final step in which a redundant bus and temporary interconnect elements have been deleted.
Figure 7B:
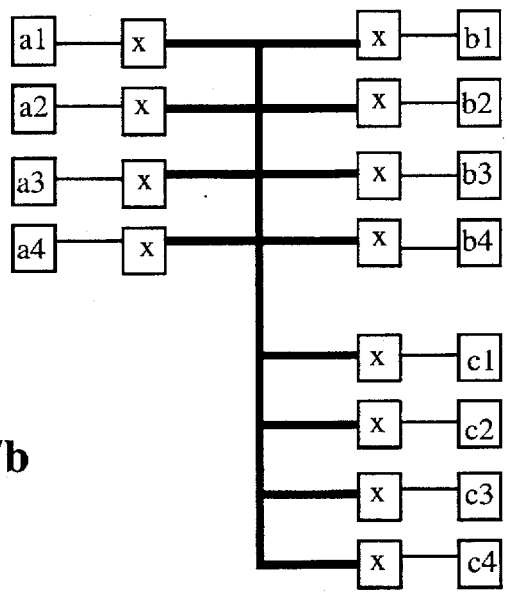
Figure 7C:
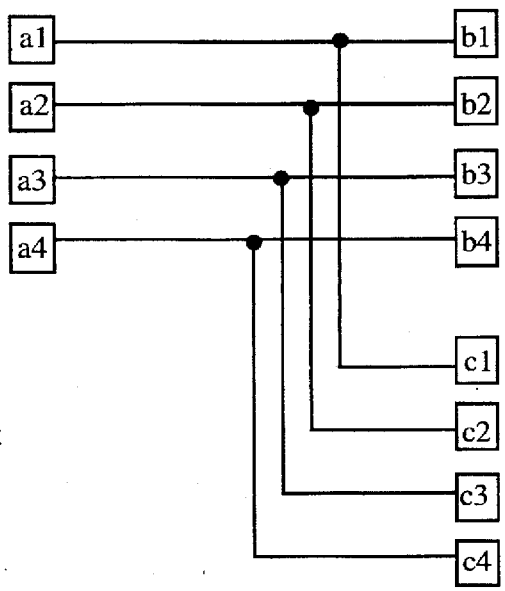

If the symbol has been expanded into its modules and the bus has correspondingly been expanded into its lines, the bus and symbol are redundant and may be removed. FIG. 7a shows three symbols A, B, and C interconnected by a bus B7. The bus is specified to be 4 bits wide. Therefore, as shown in FIG. 7b, symbol A is replaced by four elements A1–A4. Likewise symbols B and C are replaced by B1–B4 and C1–C4 respectively. Bus B7 remains and temporary elements labeled X specify the connection of the elements to the bus. As shown in FIG. 7c, the bus B7 is replaced by the lines which interconnect the elements, and the bus B7 may be removed from the graph.

A bus is deleted if all of the symbols that source and sink that bus are temporary element symbols.

Removing Unnecessary Symbols

All these symbols which have been replaced by their corresponding elements are deleted from the Symbol_Graph, yielding a graph with none of these temporary elements. This, smaller, symbol graph is checked recursively to see if it can be further simplified.

Special Arithmetic Symbols

Symbols which represent arithmetic operators will be converted to arith_hard_macro operators, with registers and tristate buffers absorbed where allowed, by the bit width of the operators. Bit widths less than about 8 are not suited to hard macros. The most efficient implementation of arithmetic operators in hard macros combines any associated registers and tristate buffers in the hard macro where possible.

There are several ways to proceed. If we extract all of the desired symbols from the graph, it means we traverse the graph three times, once for each symbol type. Instead, a copy of the symbol graph is traversed only once, and each symbol is checked to see if it is one of the three arithmetic symbols. If the function is a COUNTER it must be a BINARY counter, to be incorporated into an arithmetic hard macro. Non-binary counters cannot be mapped into ARITH functions, which use the special carry logic in XC4000-series devices.

Figure 8:
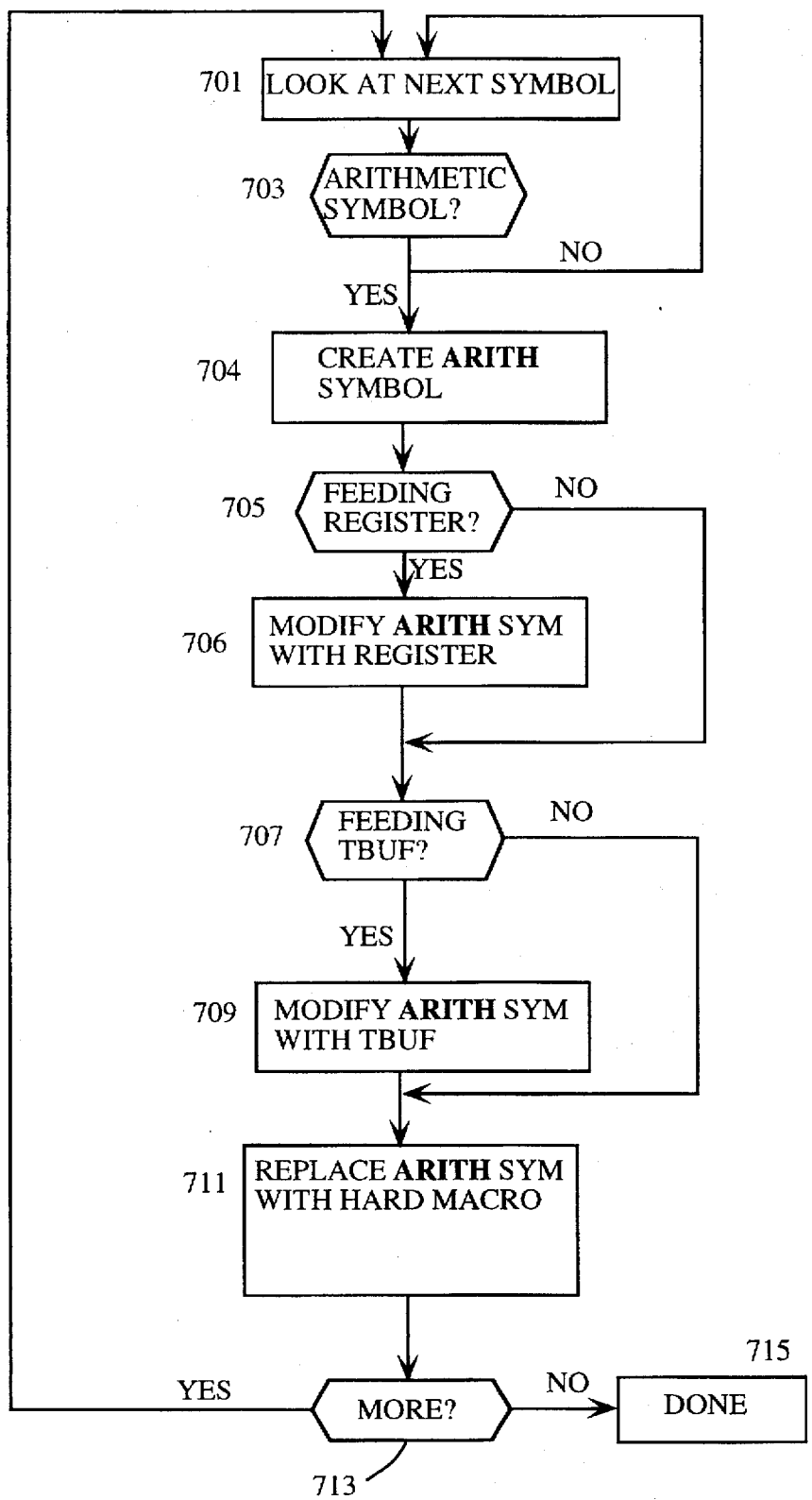
FIG. 8 shows the logic flow for grouping arithmetic symbols.

The basic algorithm used to combine arithmetic and register symbols is shown in FIG. 8. As shown in FIG. 8, each symbol is looked at in step 701, and checked to see if it is an arithmetic symbol such as an adder or accumulator in step 703. If not, it is not further considered for a hard macro and the next symbol is looked at. If it is an arithmetic symbol a general ARITH symbol is created (described in copending U.S. Pat. No. 5,574,655 which is incorporated herein by reference) to replace the arithmetic symbol. In step 705 the ARITH symbol is checked to see if it feeds a register. If so, at step 706 the ARITH symbol is modified to include the register. Next, in step 707 the ARITH symbol is tested to see if it is feeding a global tristate buffer. If so, ARITH symbol is modified in step 709 to include the tristate buffer. At step 711 the ARITH symbol is replaced with the hard macro. The routine ends when all symbols have been examined. In order to fix the signals we need to make sure that each pin is either attached to a valid signal or a '*' is placed in that position. If the signal is attached to a valid signal, then the signal graph is modified so that the new symbol is reflected in the source and/or sink of the symbols connected to the new symbol.

Merging Registers into Inputs and Outputs

If the OUTPUTS pin on an OUTPUTS symbol attaches to the OUT output of a REGISTER symbol, and the ASYNCH_CTRL, and CLK-ENA pins are not connected, the register can be merged into the output by setting the FFTYPE to OUTFF.

If the INPUTS pin on an INPUTS symbol attaches to the DATA input on a REGISTER symbol, and the ASYNCH_CTRL, SYNCH_CTRL and CLK-ENA pins are not connected, the register can be merged into the inputs by setting FFTYPE to INFF.

The fastest way to find instances where a symbol of one type follows a symbol of another type is to limit the search space by finding all instances of each type of symbol, and then collect the pairs of symbols that follow each other in the two lists. We look at each of the signals ouput by the first symbol, and see if it feeds one of the second type of symbols. Any of the symbols that sink the signal might be of the second type. The first instance is taken.

Check each of the pairs found to see if they meet the other conditions.

Later Optimization

After the Xilinx BLOX modules have been expanded any output registers that are followed by buffers have the buffers removed.

In order to modify the two graphs, the full structure must be known. That includes the signals between the 'OBUF' and the 'OUTFF', and between the 'OBUF' and the 'EXTO'. Also the symbol name of the 'EXTO' is removed.

The 'OBUF' is removed and the signal from the 'OUTFF' to the 'OBUF' is removed.

The graph is modified so that the signal from 'OUTFF' goes directly to the 'EXTO', and the 'EXTO' receives its input directly from the 'OUTFF'.

Finally, the signal that used to go from the 'OBUF' to the 'EXTO' now goes from the 'OUTEF' to the 'EXTO'.

We claim:

1. A method of mapping from symbols of a user logic design to resources on a chip comprising the steps of:

(a) searching said user logic design until an arithmetic symbol is identified; then (b) creating a general arithmetic symbol and replacing said arithmetic symbol with said general arithmetic symbol, wherein said general arithmetic symbol provides for selectively implementing one of a plurality of different functions to map arithmetic functions optimally into said resources.

2. The method of claim 1 further including the steps of:

(c) determining whether said general arithmetic symbol provides signals to a register;

(d) if said general arithmetic symbol provides signals to a register, then modifying said general arithmetic symbol to include said register.

3. The method of claim 2 further including the steps of:

(e) if said general arithmetic symbol fails to provide signals to said register, or after step (d), determining whether said general arithmetic symbol provides signals to a tristate buffer.

4. The method of claim 3 further including the step of:

(f) if said general arithmetic symbol provides signals to said tristate buffer, then modifying said general arithmetic symbol to include said tristate buffer.

5. The method of claim 4 further including the step of:

(g) if said general arithmetic symbol fails to provide signals to said tristate buffer, or after step (f), identifying another symbol.

6. The method of claim 5 further including the step of:

(h) repeating steps (a) through (g) until no further symbols are identified.

* * * * *

UNITED STATES PATENT AND TRADEMARK OFFICE
CERTIFICATE OF CORRECTION

PATENT NO.   : 5,737,234
DATED        : April 7, 1998
INVENTOR(S)  : Jorge P. Seidel It is certified that error appears in the above-identified patent and that said Letters Patent is hereby corrected as shown below:

On the title page, item [73] Assignee, should read—

Xilinx, Inc.
    San Jose, California

--.

Signed and Sealed this

Twenty-ninth Day of August, 2000

Attest:

Q. TODD DICKINSON

*Attesting Officer*       *Director of Patents and Trademarks*